United States Patent [19]

Nakamura et al.

[11] Patent Number: 4,525,523

[45] Date of Patent: Jun. 25, 1985

[54] NEGATIVE-WORKING PHOTORESIST COATING COMPOSITION

[75] Inventors: Hatsuo Nakamura; Tiharu Kato, both of Yokohama; Toshio Yonezawa, Yokosuka; Shigeo Koguchi, Kitakyushu; Kiyoto Mori, Kasukabe; Masahiko Igarashi, Soka, all of Japan

[73] Assignees: Kanto Chemical Co., Inc., Tokyo; Tokyo Shibaura Denki Kabushiki Kaisha, Kawasaki, both of Japan

[21] Appl. No.: 526,820

[22] Filed: Aug. 26, 1983

[30] Foreign Application Priority Data

Aug. 31, 1982 [JP]  Japan ................................ 57-150022

[51] Int. Cl.$^3$ ................................................ C08L 9/00
[52] U.S. Cl. .................................. 524/572; 525/333.1; 525/332.5; 525/376
[58] Field of Search ....................... 524/534, 190, 572; 525/333.1, 332.5, 376

[56] References Cited

U.S. PATENT DOCUMENTS 2,852,379  3/1958  Hepher et al. .
2,940,853  7/1960  Saguara et al. .
4,115,316  9/1978  Burke, Jr. ............................ 528/501

OTHER PUBLICATIONS

Agnihotri et al., "Structure and Behavior of Cyclized Rubber Photoresist", Photographic Science and Engineering, vol. 16, No. 6, Nov.–Dec. 1972.

Primary Examiner—Paul R. Michl
Assistant Examiner—N. Sarofim
Attorney, Agent, or Firm—Finnegan, Henderson, Farabow, Garrett & Dunner

[57] ABSTRACT

There is proposed a negative-working photoresist coating composition of an improved resolution, which comprises a cyclized polyisoprene having a weight-average molecular weight of 10,000 to 100,000 and a molecular weight distribution of not more than 1.9, an organic solvent of the cyclized polyisoprene, and a bisazido compound as a crosslinking agent.

8 Claims, 2 Drawing Figures

F I G. 1
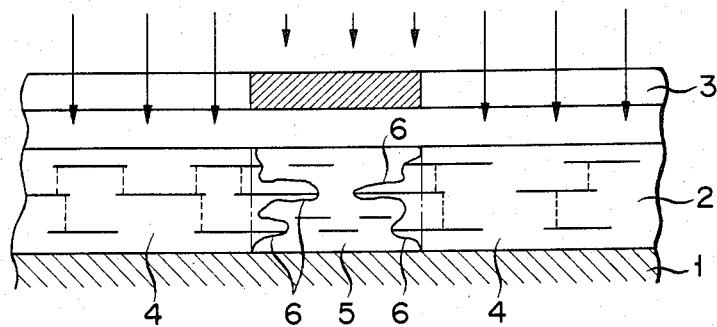
F I G. 2
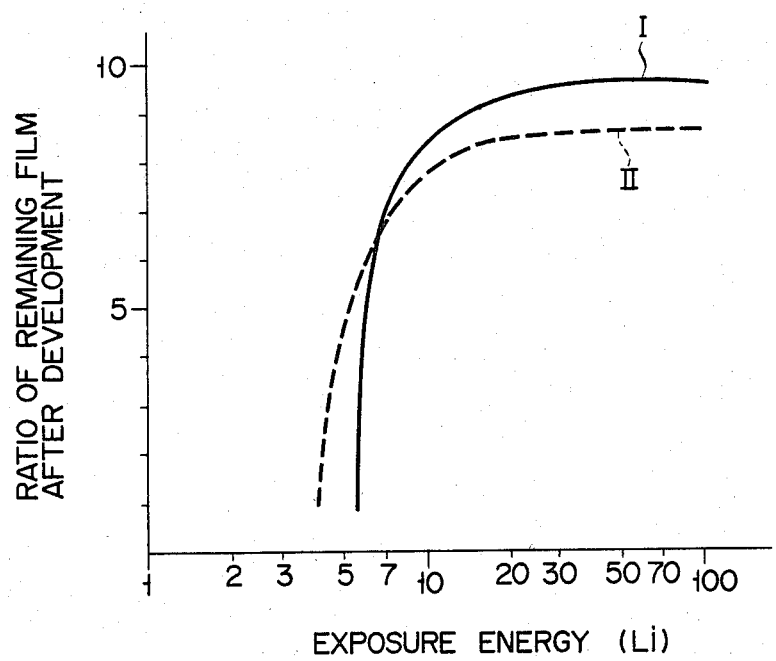

NEGATIVE-WORKING PHOTORESIST COATING COMPOSITION

BACKGROUND OF THE INVENTION

I. Field of the Invention

The present invention relates to a cyclized rubber-type negative-working photoresist coating composition which provides high resolution.

II. Description of the Prior Art

ICs are currently being packed at higher densities to form LSIs or VLSIs. With this trend, a photoresist providing a higher resolution is required.

A positive-working photoresist is conventionally used for an integrated circuit which requires a high resolution. However, a positive-working photoresist is inferior in sensitivity, adhesion strength, and mechanical strength to a negative-working photoresist. On the other hand, even though a negative-working photoresist is superior to a positive-working photoresist in these respects, it cannot respond to a requirement of micronization beyond a certain limit. That is, when a rubber-type negative-working photoresist is exposed, is developed with an organic solvent and is thereafter rinsed, the crosslinked photoresist swells to degrade the resolution.

In view of this problem, one proposal suggests changing from a negative-working photoresist of the type most often used currently which mainly consists of xylene to one of the aliphatic hydrocarbon type having 5 to 12 carbon atoms, which swells only slightly. Another proposal is proposed to adopt dry developing which results in no swelling of the photoresist at all. However, these proposals have not yet led to actual satisfactory results.

SUMMARY OF THE INVENTION

It is an object of the present invention not to improve a developing solution or method but to improve the photoresist main base material itself so as to provide a cyclized rubber-type photoresist which swells only slightly and which can improve resolution.

According to the present invention, there is provided a negative-working photoresist coating composition containing a cyclized polyisoprene having a weight-average molecular weight of 10,000 to 100,000 and a molecular weight distribution of not more than 1.9, an organic solvent of the cyclized polyisoprene, and a bisazido compound as a crosslinking agent.

As described above, according to the present invention, a cyclized polyisoprene having a weight-average molecular weight of 10,000 to 100,000 and preferably 27,000 to 49,000, and a molecular weight distribution of 1.9 or less and preferably 1.7 or less, is used.

The weight-average molecular weight is a value measured by gel permeation chromatography (GPC).

A cyclized polyisoprene used in a conventional rubber-type photoresist composition has a far larger weight-average molecular weight than that of the present invention (within the range of one hundred thousand to two hundred and eighty thousand), and has a molecular weight distribution of about 2.0 to 2.7.

The molecular weight distribution is obtained by dividing the weight-average molecular weight ($\overline{M}_w$) by the number-average molecular weight ($\overline{M}_n$).

As described above, it was found, according to the studies made by the present inventors, that a cyclized polyisoprene having a weight average molecular weight and a molecular weight distribution in certain ranges can significantly improve the resolution of the photoresist. This is considered to be attributable to the following:

As shown in FIG. 1, when a photoresist film 2 formed on a wafer 1 is exposed to ultraviolet light (indicated by arrows) through a photomask 3, cyclized polyisoprene (indicated by the solid lines) is crosslinked by a crosslinking agent to form giant molecules at a crosslinking portion 4. However, the cyclized polyisoprene is not crosslinked at a non-crosslinking portion 5. When this photoresist film 2 is developed, the cyclized polyisoprene at the non-crosslinking portion 5 is dissolved and is removed. However, the cyclized polyisoprene molecule having one terminal end at the crosslinking portion 4 and the other terminal end at the non-crosslinking portion 5 is not dissolved. Then, a part 6 of the molecular chain remains extending into the non-crosslinking portion 5, thus resulting in an irregular pattern. Accordingly, when the pattern width is narrowed, the cyclized polyisoprene molecules extending from both sides are eventually connected to each other and patterning cannot be performed. In contrast to this, a cyclized polyisoprene used in the photoresist of the present invention has a weight average molecular weight which is in the small range of 10,000 to 100,000 and has a significantly short molecular chain when compared with a conventional chain length. Accordingly, extension of molecular chains into the non-crosslinking portion 5 is prevented, an image with sharp edges can be formed, and the resolution is improved.

The effect of the molecular weight distribution on the resolution will now be described. When the weight-average molecular weights of polymers are assumed to be the same, the narrower the molecular weight distribution of the polymer, the greater the difference between the dissolution rates of the exposed and non-exposed portions of the photoresist. This is considered to result in a good contrast ($\gamma$ value) and sensitivity. From the above, it is seen that a narrower molecular weight distribution results in a better resolution.

The effect of the present invention will now be described with reference to swelling after development, which is the most important factor adversely affecting the resolution of cyclized polyisoprene. The development reaction of a photoresist consisting of a cyclized polyisoprene is a swelling dissolution phenomenon caused by the developer. Swelling of the photoresist is caused by thermal diffusion which is caused by a difference in concentration of the developer in the photoresist. Swelling cannot be stopped until the developer concentration in the photoresist reaches a certain value. In general, the swelling amount (Q) of a polymer can be given by the following equation:

$$Q = [(0.5 - \mu) \times \overline{M}_w / (\rho_p V_a)]^{3/5}$$

where $\mu$ is the mutual action coefficient of a solute and a solvent, $\rho_p$ is the density of a polymer and $V_a$ is the molar volume of the solvent.

When the weight-average molecular weight ($\overline{M}_w$) of a cyclized polyisoprene is small, the swelling amount (Q) can be decreased, and the resolution is improved.

A crosslinking agent (sensitizer) to be used in a rubber-type photoresist coating composition of the present invention may be a known bisazido compound crosslinking agent such as 2,6-di-(4'-azidobenzal)-4-methylcyclohexanone or 2,6-di-(4'-azidobenzal)-cyclohexanone. The amount of the crosslinking agent to be used is 2 to 5% by weight based on the amount of the cyclized polyisoprene and can be determined according to the sensitivity, the degradation in performance, etc. of the photoresist.

A stabilizer, a light-absorbing agent and other additives of a conventional rubber-type photoresist coating composition may be added to the rubber-type photoresist coating composition according to the present invention, as needed. The amounts of these additives can be determined in accordance with each application so as to provide optimal performance. A solvent for dissolving solid contents may be another known organic solvent such as an aromatic hydrocarbon-type organic solvent like xylene which is used in a rubber-type photoresist coating composition of this type.

According to a photoresist of the present invention, since a cyclized polyisoprene as the main base material has a low molecular weight and a narrow molecular weight distribution, it has a short molecular chain, causes little swelling, and has a high contrast ($\gamma$ value). The composition of the present invention can provide a resolution of 1.5 to 2.0 $\mu$m as compared to a conventional resolution of 3.0 $\mu$m. A coating of the composition of the present invention can be formed sufficiently thick, and the sensitivity is also comparable to that of the conventional photoresist coating composition.

BRIEF DESCRIPTION OF THE DRAWINGS

FIG. 1 is a representation showing the relationship between the molecular chain length and resolution when a photoresist is developed; and FIG. 2 is a graph showing characteristics of a negative-working photoresist of the present invention together with those of a conventional photoresist.

DETAILED DESCRIPTION OF THE PREFERRED EMBODIMENTS

The present invention will now be described by way of examples.

EXAMPLE 1

A rubber-type photoresist coating composition I was prepared by adding 3% by weight of 2,6-di-(4'-azidobenzal)-4-methylcyclohexanone to a cyclized polyisoprene having a weight-average molecular weight of 49,000 and a molecular weight distribution of 1.7.

As a control, a photoresist coating composition II was also prepared following the same procedures of Example 1 except that the cyclized polyisoprene used had a weight average molecular weight $\overline{M}_w$ of 142,000 and a molecular weight distribution ($\overline{M}_w/\overline{M}_n$) of 2.2.

The compositions I and II were respectively spin coated on a wafer to a thickness of 1.0 $\mu$m by a spin coater in a test pattern having widths of 1.5, 1.75, 2.0, 2.5, 3.0, 3.5, and 4.0 $\mu$m. The composition II provided a minimum resolution of about 3.0 $\mu$m, and caused pattern distortion and was unable to provide a linear pattern with a smaller width. In contrast to this, the composition I provided a minimum resolution of 1.5 $\mu$m, thus resulting in an improvement of about 1.5 $\mu$m in resolution.

As for the coating thickness, the photoresist of Example 1 provided a coating thickness of 1.15 $\mu$m with a spin coater of 4,000 rpm despite its low molecular weight. Thus, the photoresist of Example 1 was satisfactory in this respect. When the sensitivity of the photoresist of Example 1 was examined using an integrating exposure meter "Mask aligner PLA 500F" (Canon), a sensitivity curve as shown in FIG. 2 was obtained with a coating thickness of 1.0 $\mu$m. Thus, the photoresist of Example 1 was satisfactory in this respect as well. In general, when the weight-average molecular weight of the main base material of the photoresist is decreased, the sensitivity is degraded. However, in the case of a photoresist main base material of the present invention, the narrow molecular weight distribution range apparently prevents such a degradation in sensitivity. The ratio of remaining film after development as defined by the ratio of the film thickness of the photoresist after development to the original coating thickness is as shown in FIG. 2, thus providing a practical photoresist film.

The $\gamma$ value, which is a well known index of resolution, will be examined. The $\gamma$ value is defined by the gradient of the linear portion of a curve obtained when exposure energy is plotted along the axis of abscissa and the ratio of remaining film after development is plotted along the axis of ordinate. Thus, the $\gamma$ value indicates the dependency of the ratio of remaining film on the exposure energy. A higher $\gamma$ value indicates a higher resolution. FIG. 2 shows a characteristic curve I of the composition I (Example 1) having a coating thickness of 1.0 $\mu$m and a characteristic curve II of the composition II (control). It is seen from FIG. 2 that the $\gamma$ value of the composition II is 1.67 while that of the composition I is 5.25. Accordingly, the photoresist composition of the present invention provides a higher resolution than the conventional composition.

EXAMPLE 2

A rubber-type photoresist coating composition was prepared following the procedures in Example 1 using a cyclized polyisoprene having a weight average molecular weight of 27,000 and a molecular weight distribution of 1.2. The resultant composition was subjected to the same test as in Example 1, and provided a minimum resolution of 1.5 $\mu$m, resulting in an improvement in resolution of about 1.5 $\mu$m. Good results similar to those in Example 1 were also obtained with the composition of Example 2 regarding the ratio of remaining film and the $\gamma$ value.

EXAMPLE 3

A rubber-type photoresist coating composition was prepared following the procedures in Example 1 using a cyclized polyisoprene having a weight average molecular weight of 37,000 and a molecular weight distribution of 1.2. The resultant composition was subjected to the same test as in Example 1, and provided a minimum resolution of 1.5 $\mu$m, resulting in an improvement in resolution of about 1.5 $\mu$m. Good results similar to those in Example 1 were also obtained with the composition of Example 3 regarding the ratio of remaining film and the $\gamma$ value.

EXAMPLE 4

A rubber-type photoresist coating composition was prepared following the procedures in Example 1 using a cyclized polyisoprene having a weight average molecular weight of 62,000 and a molecular weight distribution of 1.9. The resultant composition was subjected to the same test as in Example 1, and provided a minimum resolution of 2.0 $\mu$m, resulting in an improvement in resolution of about 1.0 $\mu$m. Good results similar to those in Example 1 were also obtained with the composition of Example 4 regarding the ratio of remaining film and the γ value.

What is claimed is:

1. A negative-working photoresist coating composition comprising a cyclized polyisoprene having a weight-average molecular weight of 10,000 to 100,000 and a molecular weight distribution of not more than 1.9, an organic solvent of the cyclized polyisoprene, and a bisazido compound as a crosslinking agent.

2. A coating composition according to claim 1, wherein the weight-average molecular weight of the cyclized polyisoprene is in a range of 27,000 to 49,000.

3. A coating composition according to claim 1, wherein the molecular weight distribution of the cyclized polyisoprene is not more than 1.7.

4. A coating composition according to claim 1, further comprising a predetermined amount of a stabilizer.

5. A coating composition according to claim 1, further comprising a predetermined amount of a light-absorbing agent.

6. A coating composition according to claim 1, wherein the organic solvent is an aromatic hydrocarbon-type solvent.

7. The coating composition according to claim 1, wherein the weight-average molecular weight of the cyclized polyisoprene is in a range of 27,000 to 62,000 and wherein the molecular weight distribution of the cyclized polyisoprene is from 1.2 to 1.9.

8. The coating composition of claim 7 wherein the weight-average molecular weight of the cyclized polyisoprene is in a range of 27,000 to 49,000 and wherein the molecular weight distribution of the cyclized polyisoprene is from 1.2 to 1.7.

* * * * *